United States Patent [19]

Bonyhard

[11] 4,237,544
[45] Dec. 2, 1980

[54] MAGNETIC MEMORY ORGANIZATION

[75] Inventor: Peter I. Bonyhard, New Providence, N.J.

[73] Assignee: Bell Telephone Laboratories, Incorporated, Murray Hill, N.J.

[21] Appl. No.: 960,948

[22] Filed: Nov. 15, 1978

[51] Int. Cl.³ .................... G11C 11/02; G11C 29/00
[52] U.S. Cl. .................................. 364/900; 365/15; 365/74
[58] Field of Search ... 364/200 MS File, 900 MS File; 365/15

[56] References Cited

U.S. PATENT DOCUMENTS

| | | | |
|---|---|---|---|
| 3,508,225 | 4/1970 | Smith | 365/19 |
| 4,027,283 | 5/1977 | Tang | 365/15 |
| 4,090,251 | 5/1978 | Flannigan | 365/15 |
| 4,159,412 | 6/1979 | Naden et al. | 365/15 |

OTHER PUBLICATIONS

E. Hoffman, Designing a Magnetic Bubble Data Recorder, Computer Design, Apr. 1976, pp. 99–107.

Primary Examiner—Gareth D. Shaw
Assistant Examiner—David Y. Eng
Attorney, Agent, or Firm—Herbert M. Shapiro

[57] ABSTRACT

A magnetic bubble memory herein includes a direct propagation path between a bubble generator and a detector. A control circuit is adapted to store indications of the current state of the memory and the address of presently accessed data in the path responsive to a power failure signal. Portions of the memory are organized in a familiar major, minor mode, data from two major loops being replicated into the direct path.

The arrangement exhibits improved access times, improved data rates and is secure from power failure problems. Moreover, the memory organization permits the realization of large capacity chips without requiring block replication.

8 Claims, 5 Drawing Figures

(a, b, c, d, AND e, ARE INTEGER CONSTANTS FIXED FOR A GIVEN CHIP DESIGN.)

4,237,544

MAGNETIC MEMORY ORGANIZATION

FIELD OF THE INVENTION

This invention relates to magnetic bubble memories.

BACKGROUND OF THE INVENTION

Magnetic bubble memories are well known in the art. One mode of propagating bubbles is called a "field access" mode employing a rotating magnetic field as disclosed in A. H. Bobeck, U.S. Pat. No. 3,534,347, issued Oct. 13, 1970.

A familiar organization for a magnetic bubble field access memory employs a major/minor configuration as disclosed in P. I. Bonyhard, U.S. Pat. No. 3,618,054, issued Nov. 2, 1971. The basic major/minor configuration utilizes a major accessing loop, and minor loops which serve as permanent stores. A variety of other major/minor configurations are also well known in the art. Several are described in, for example, "Systems Analysis for Spaceborne/Airborne Magnetic Bubble Mass Memory", *Rockwell International,* Report No. AFAL-TR-74-270, contract or grant No. F33615-73-C-1103.

In one particularly attractive major/minor configuration a bubble generator and a bubble detector constitute part of a major loop and the minor loops are accessed by the major loop through transfer in/out gates. A problem with this type of configuration is that data cannot be accessed until the next preceding data are transferred back into the minor loops. During power failure, data in the major loop may be lost because the address of the data cannot be stored in this configuration or in the controller without considerable additional circuitry.

In another major/minor configuration similar to that disclosed in the above-mentioned Bonyhard patent, there are two major paths instead of a major loop to which the data is transferred. The first major path contains a generator which generates bubbles which are then swapped with data previously stored in the minor loops for permanent storage there. The second major path contains a detector which detects bubbles replicated into the path from the minor loops.

This last-mentioned configuration saves data from being lost during a power failure because the data are replicated rather than transferred into a major path for detection and thus never leave safe positions in the minor loops. Unfortunately, because of the number of replicate ports or gates used in the configuration, a large voltage is required to drive the replicators. Moreover, should a power failure occur, the resynchronization of data requires additional housekeeping circuitry.

A failsafe, non-volatile bubble memory can be designed with a housekeeping loop in addition to the major and minor loops of a bubble configuration. One such housekeeping loop is disclosed in J. L. Smith, U.S. Pat. No. 3,508,225, issued Apr. 21, 1970. In that patent, an additional bubble propagation channel is operative as a counter having a known number of stages between a bubble generator and a detector. Because bubbles propagate one position each time a field rotates one cycle, a magnetic bubble is advanced stage by stage in the counter in synchronism with the propagation or bubbles introduced into the major loop from the minor loops. A loss of power merely stops a bubble in the counter. When power is next supplied, that bubble advances to the detector supplying, then, the address for the word in the major loop. But this arrangement requires additional driver and detector implementations. The problem to which this invention is directed is, thus, to obtain a relatively fast bubble memory which is secure from power failure problems without requiring block replication or additional implementation.

BRIEF DESCRIPTION OF THE INVENTION

A bubble memory, in accordance with one embodiment of this invention, is organized so that information is transferred from first and second sets of minor loops into first and second associated major loops for synchronous movement to first and second replicate/swap ports (or gates). Information is replicated from those ports into a direct path between a bubble generator and a bubble detector, during a read operation, by a sequence of replicate pulses applied to electrical conductors operating the ports. A power failure at any time in the operation causes a signal to be applied to the controller for storing an indication of the current state of the memory (master clock count) and the address of transferred data in the direct path. The controller also functions to ignore spurious output signals when start up occurs so that the next signals observed from the detector after start up are representative of the state of the memory at shutdown and of the address previously accessed. Those signals are applied to a master counter and an address register in the controller for purposes of reestablishing operation at the address called for previously.

The organization of the controller in response to a power failure signal in combination with a bubble generator for storing the state of the memory and/or an address of potentially lost data is considered particularly novel. Further, the synchronous operation of a detector to accept, first, only the stored memory state and address data and to apply that data to the master counter and address register for a resynchronizing operation also is considered novel.

A specific organization of a field access bubble memory including two major loops associated with replicate/swap ports spaced apart from each other and operative to replicate data into a direct path between a bubble generator and the detector has the further advantage that the failsafe organization can be implemented in a manner to obviate the necessity for large numbers of replicate ports. This particular organization also is considered novel. Thus, the solution to the above-mentioned problem of recovery from a power failure is to organize a bubble memory to include an accessing path adapted to move data during normal operation and to move master clock count and/or address information on the occurrence of a power outage. In the specific embodiment described, the bubble chip arrangement further obviates the necessity for block replication.

DETAILED DESCRIPTION

Figure 1:
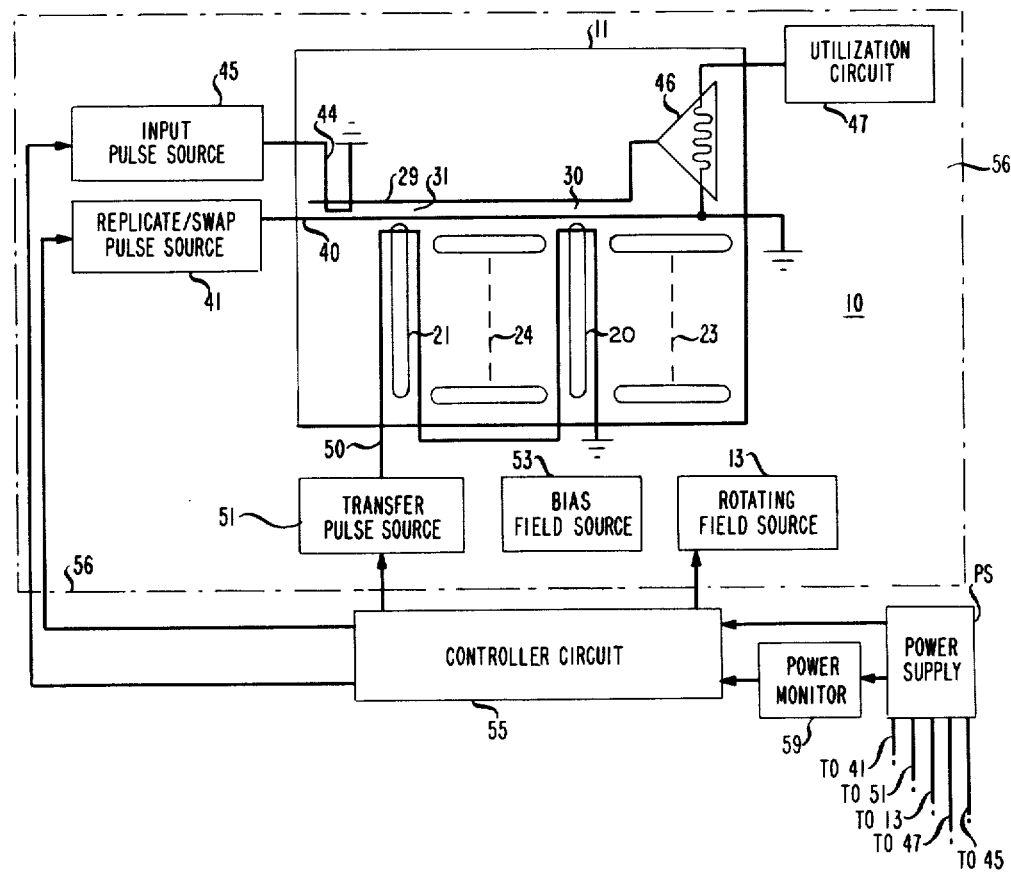
FIGS. 1 and 4 are block diagrams of a magnetic bubble memory arrangement in accordance with this invention.

FIG. 1 shows a schematic diagram of an illustrative embodiment 10 of this invention. The memory comprises a layer 11 of magnetic material in which magnetic bubbles can be moved. Such a layer typically comprises a single cyrstal film of rare earth ions garnet grown epitaxially on a substrate of nonmagnetic garnet. Amorphous layers of bubble material are also knwon in the art.

Figure 2:
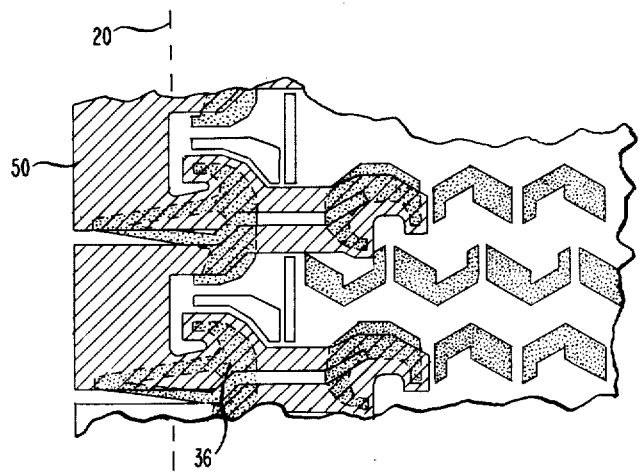
FIG. 2 is a diagram of a portion of the arrangement of FIG. 1.

The movement of bubbles in layer 11 is determined by a pattern of magnetic elements which responds to a magnetic field which reorients in the plane of layer 11 in the illustrative field access type of bubble memory. Representative ones of such elements are shown in FIG. 2. In FIG. 1, the paths of bubble movement are represented by line diagrams characteristic of major/minor bubble organizations. Block 13 represents a source of rotating field.

The major/minor organization characteristically includes a major loop into which bubble patterns are moved from permanent storage in an associated set of minor loops. In FIG. 1, two major loops 20 and 21 are shown. Each major loop has associated with it a minor loop 23 and 24 respectively. The organization shown is intended primarily to make of an essentially square chip area. As a general principle, the squarer the chip, the easier it is to handle.

The illustrative embodiment of the invention includes a bubble memory in which data is transferred to major loops 20 and 21 from the sets of minor loops in an operation similar to a familiar data swap. The implementation of a transfer function in a magnetic bubble memory is disclosed, for example, in U.S. Pat. No. 4,007,453, of the present invention issued Feb. 8, 1977. The specific form of the implementation used in experimental circuits is shown in FIG. 2 and may be appreciated by those skilled in the art to be operative as a swap function. As can be seen from the Figure, asymmetric mushroom-shaped elements define major loop 20 as represented by element 36. An electrical conductor 50 overlies the permalloy elements (separated by a suitable insulating layer). Conductor 50 is shown in FIG. 2 connected between a transfer pulse source 51 and ground.

Path 29 is coupled at one end by a bubble generator and at the other end by a bubble detector. Specifically, a bubble generator 44 is shown coupled to path 29 at the left end thereof as viewed. The generator may, for example, be of the type disclosed in Y. S. Chen et al, U.S. Pat. No. 3,789,375 issued Jan. 29, 1974. Generator 44 is shown connected between an input pulse source 45 and ground. The path terminates at a bubble expander detector 46. A suitable expander detector is disclosed in A. H. Bobeck, U.S. Pat. No. 3,810,132 issued May 7, 1974. The detector applies its output to a utilization circuit 47. Thus, path 29 can be seen to define a direct bubble propagation path between generator 44 and detector arrangement 46.

Replicate/swap functions 30 and 31 couple path 29 and are spaced apart from one another a number of stages such that data (a bubble or no bubble) transferred into the two major loops from the sets of minor loops in conventional fashion constitute a continuous train of bits in the major path. Transfer conductor 50 is coupled to the minor loops to this end. Conductor 50 is shown connected between a transfer pulse source 51 and ground.

A bias field, antiparallel to the magnetization of a bubble, is provided by a bias field source 53. As is well known, such a bias field maintains a bubble at a nominal operating diameter and is directed normal to the plane of layer 11.

Sources 13, 41, 45 and 51 and circuit 47 are connected to a controller circuit 55 for activation and synchronization. The various sources and circuits herein may be any such circuits capable of operation in accordance with this invention. The controller circuit, however, is operative in conjunction with other sources and circuits shown in FIG. 1 to achieve a new and unexpected result.

As a context for understanding the cooperation of the various elements, it is helpful to understand first the normal operation of the memory of FIG. 1 as well as the operation when a power failure or outage occurs. All bubble movement in layer 11 occurs in response to a magnetic field reorienting (i.e., rotating) in the plane of layer 11. Source 13 provides such a field under the control of controller circuit 55 in a well known manner, for example, as disclosed in A. H. Bobeck et al, U.S. Pat. No. 3,879,585, issued Apr. 22, 1975. Each cycle of the rotating field advances bubbles in layer 11, one stage in the respective paths. It is well established that the number of stages in the paths are chosen to cause selected bubbles to be disposed properly for operation as is amply discussed in the last-mentioned patent. If each minor loop includes, for example, 1000 stages, the associated bits in the loops advance to transfer positions once in 1000 cycles of the field. If a transfer pulse on conductor 50 occurs when a particular bit in each loop is so positioned, those bits are transferred to the associated major loops. Controller 55 of FIG. 3 includes a master counter (or state of memory register) MC which is incremented each cycle of the rotating field and returns to zero after 1000 cycles.

Each major loop typically associates two stages with each minor loop. Thus, if 500 minor loops are associated with each major loop (giving rise to a total of one thousand 1000 bit loops or a one megabit chip), the major loops nominally include at least 2000 stages each. The four-to-one ratio depends primarily on the fact that the typical bubble transfer gate requires two stages of the receiving loop for each minor loop and that there are no minor loops on the return side of the major loop. FIG. 2 shows a relatively large element 36 when compared to other path-defining elements. When a major path includes relatively large elements, the ratios of the numbers of stages in the various paths are changed in accordance with well-understood principles. So the general geometric layout of the bubble chip (layer 11) can be visualized as an aid to the visualization of bubble movement in the memory of FIG. 1.

Each major loop, after a transfer operation, contains 500 bits of data to be moved to the major path 29 for read out. Five hundred consecutive swap pulses operate to swap these bits with others already present in line 29 (from generator 44) if a write operation is in process. Of course, in order to form a continuous stream of data in path 29, ports 30 and 31 are placed 500 stages apart. The incoming data is transferred back into vacancies formed by the original transfer of the accessed bits thus storing new information in the previously-vacated locations of the minor loops.

That new information originates from an external source, for example, a remote central processing unit of a host computer and is applied to a buffer store (not shown) in the controller. The output of the buffer store controls source 45 of FIG. 1 to generate a bubble pattern for permanent storage replacing the accessed bits.

Meanwhile, the bits transferred to path 29 advance to detector arrangement 46 where they are read out during a read operation and, in effect, discarded during a write operation.

Figure 3:
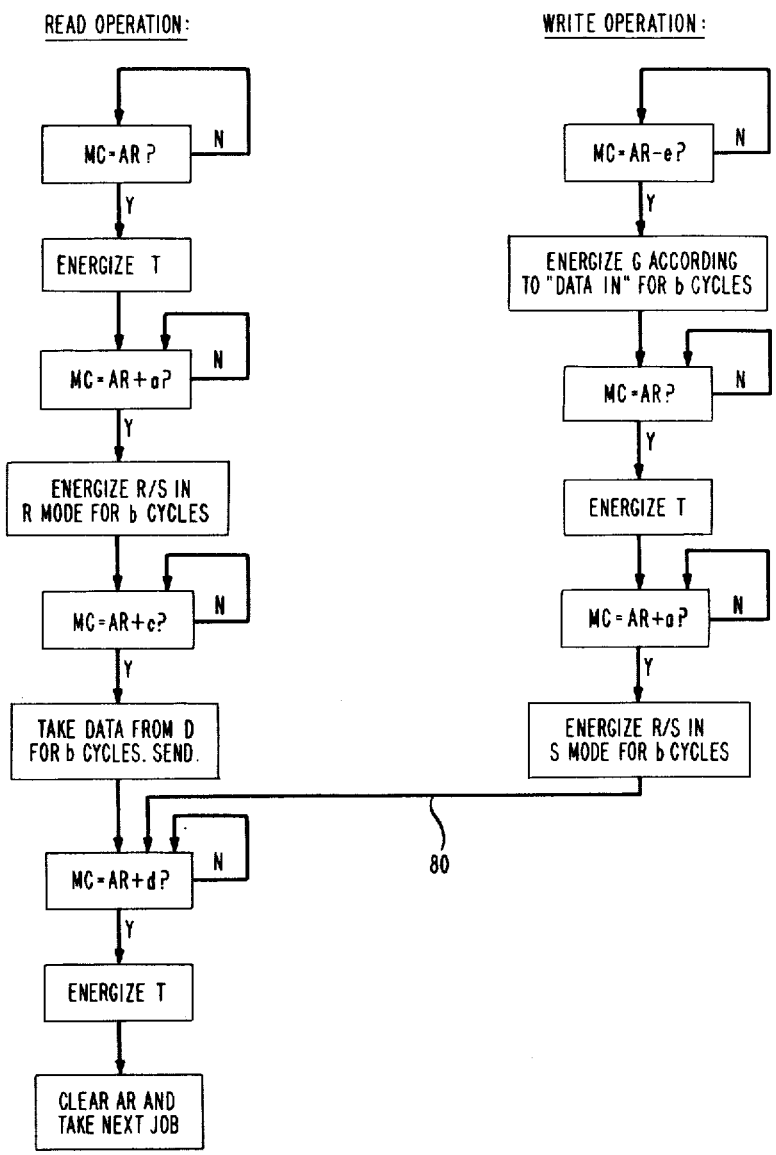
FIGS. 3 and 5 are flow diagrams of the operations of the arrangement of FIGS. 1 and 4.
Figure 4:
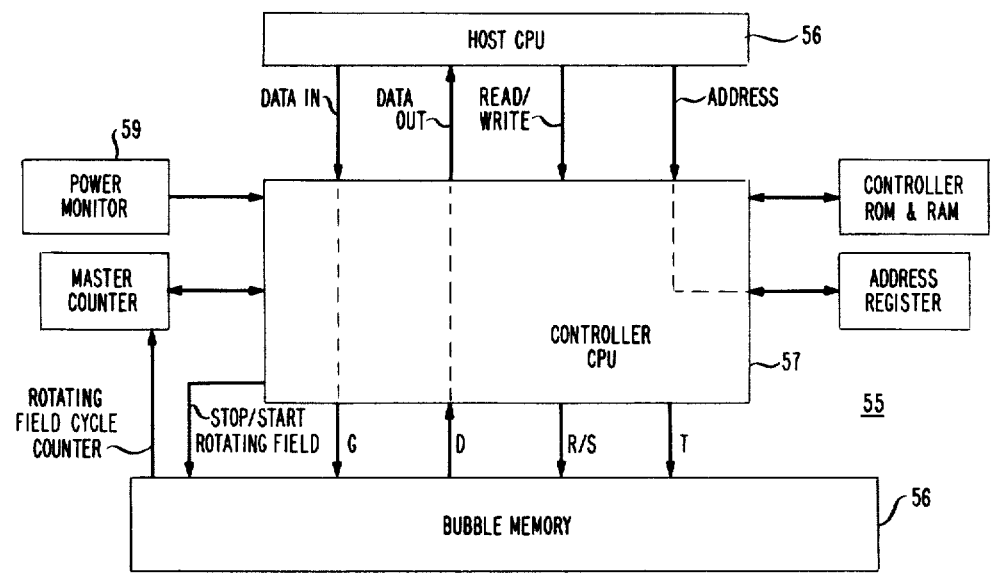

FIG. 3 shows a flow diagram of both read and write operations in the normal operation of the memory arrangement of FIG. 1. FIG. 4 shows a block diagram of the controller 55 where block 56 represents all the remaining elements of FIG. 1. The controller includes a central processing unit (CPU) 57 operative to control the generator (G), stop/start (S/S), the detect (D), the replicate/swap (R/S), and the transfer (T) functions as indicated by the so-designated arrows in FIG. 3. The controller also controls the data in, data out, read/write, and address functions as is also indicated by the so-designated arrows in the Figure. FIG. 3, thus, if rendered in terms of the letter designations in FIG. 4.

READ OPERATION

The read operation commences when an address is applied to the controller from an external source (the CPU 56 of a host computer). The top block of FIG. 3 to the left as viewed represents the familiar operation—does the master counter count (MC) (the current stage of the memory) equal the address in the address register (AR). If not (N), repeat. If yes, energize the transfer (T) function (conductor 40 of FIG. 1). This results in the data in the selected address being moved to the major loops.

The operation continues with $MC=AR+a$? as indicated by the next block, where a corresponds to the number of cycles necessary for the data to get from the transfer port between the major and the minor loops to the closest replicate/swap port or gate. If $MC \neq AR+a$, then the operation repeats. If $MC=AR+a$, then the replicate/swap (R/S) source 41 is energized in the replicate mode for b cycles for replicating data into the major line. The letter b is an integer constant equal to the number of minor loops and may be multiplied by a factor of two if the relatively large elements are not utilized in the major path as is discussed hereinbefore.

The next block indicates a search for $MC=AR+c$ where c is the number of steps from the transfer port between the minor loop closest to the detector and the detector. Each no answer causes a reiteration, a yes answer leads to the next subsequent block in FIG. 3 which is—take data from D for b cycles and send it to the CPU of the host computer.

Thereafter, the search for $MC=AR+d$, where d is the number of steps around the major loop, commences. At this time, a restore pulse is operative to move the previously transferred data back into the minor loop vacancies created by the previous transfer. When $MC=AR+d$, source 51 of FIG. 1 pulses conductor 50. This is shown as "energize T" in the next block in FIG. 3. Data are now returned to the minor loops. At this juncture the address register (AR) is cleared and the next job is accepted as indicated by the last block.

WRITE OPERATION

The write operation similarly commences with a search for $MC=AR-e$ where e is the number of steps from the generator to the replicate/swap port closer to the detector minus a. Therefore, generation starts when the master counter is equal to the address register minus e. Each no response causes a reiteration. A yes response initiates an energization of the generator for b cycles as indicated by the next block.

Next a search for $MC=AR$ commences. A yes response leads to an energization of the transfer conductor (50 of FIG. 1) resulting in transfer of data to the major loops.

The next search is for $MC=AR+a$. Again a yes response leads to energization of R/S (conductor 40 of FIG. 1) in the swap mode for b cycles. This results in data exchange between the major path and the major loops. The subsequent action is indicated by the bottom three blocks under the read operation as indicated by arrow 80 in FIG. 3.

The description of the write and read operations are now completed. These operations are well understood in the art as is the implementation and control of such operations. The occurrence of the various operations is different when a power-outage occurs and it is to this aspect that we will now turn our attention.

When a power outage or failure occurs, there may be data in any one or several of the minor loops, or the major loops, or the major path. Regardless of the position of the accessed data in the memory, the address of the data is in an address register. That address changes periodically, as do the data currently being accessed. It will now be shown how the data in memory are secured even through a power outage occurs during access. First, as is typical of bubble memories, the master counter or clock (MC) synchronizes all operations. It is itself driven from the rotating field source (13) and records the rotating field cycle count.

A power outage is said to be complete when the rotating field decays to a point at which bubbles do not move. Characteristic of rotating field driver circuits are a 60 cycle power supply and a full wave rectifier, the circuit having a capacitance such that a peak drive occurring at 18 millisecond intervals is common for 100 kilohertz operation of the memory. Any bubble memory powered by an a.c. source through a full wave rectifier at 60 cycles delivers at least eight milliseconds of power before a power failure affects the memory. A power outage under these conditions still results in sufficient rotating field to drive even a single chip memory for at least eighteen cycles (i.e., 1.8 milliseconds) after the outage commences. A power monitor 59 monitors the power to the rotating field source (13) from a power supply PS shown in FIG. 1 and signals the controller CPU when a power outage commences.

POWER OUTAGE OPERATION

Figure 5:
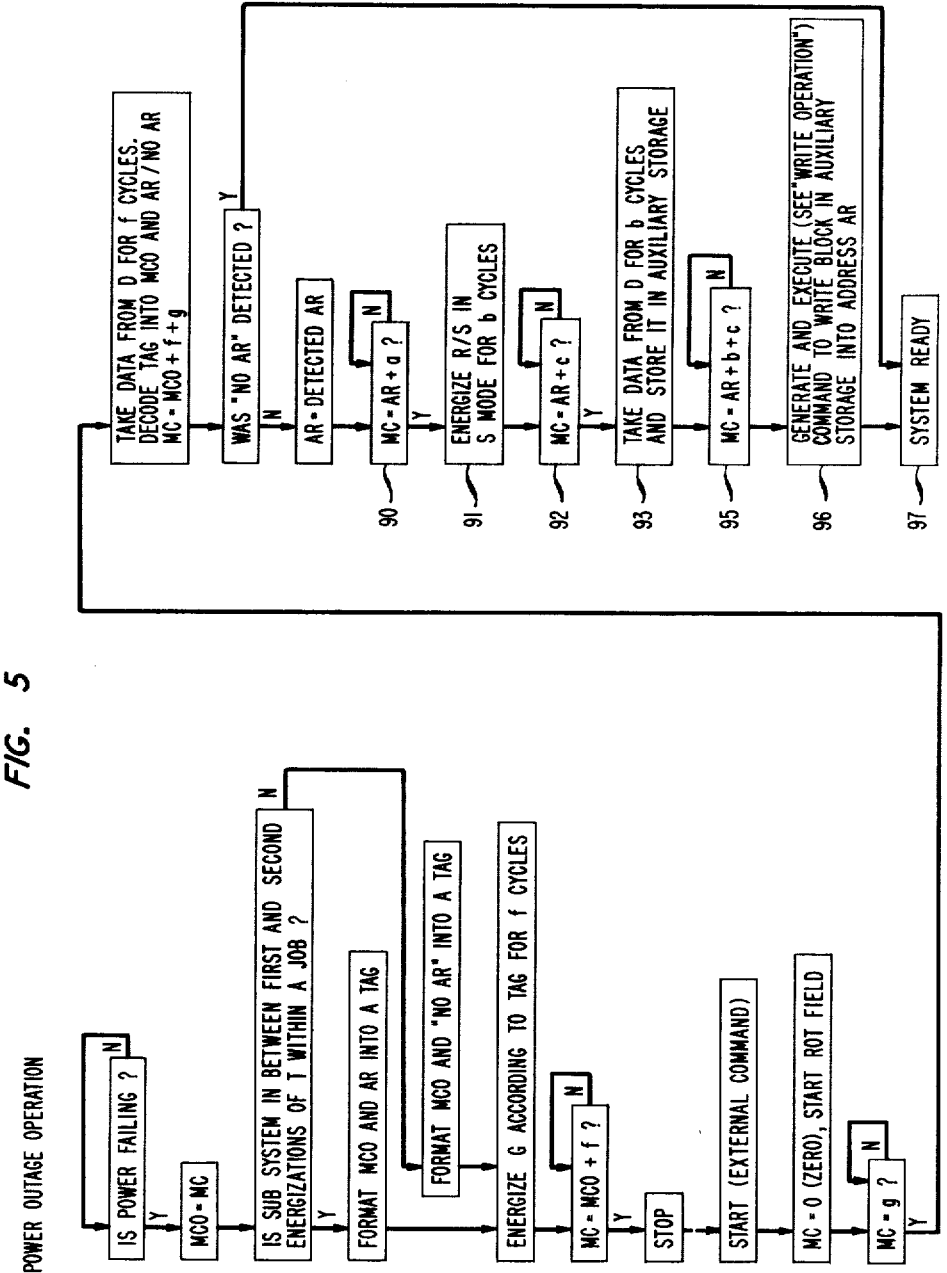

The steady state is indicated by the top block in FIG. 5 and is shown by the legend "is power failing". Monitor 59 of FIG. 4 provides an indication of the power condition. Monitor 59 may comprise a threshold sensor responsive to the difference between a standard voltage (derived from a zener diode as is well known in the art) and the actual power supply voltage. A yes response corresponds to the difference being above a predetermined threshold. If a yes response occurs, the instant count MCO of the master counter MC is determined (i.e, stored in RAM). The next block indicates a determination as to whether or not the system is between first and second energization of the transfer (in and out) within a job as indicated by the third block from the top in FIG. 5. If a yes response occurs, MCO and AR are formatted into a tag (i.e., in RAM) and G is energized, according to the tag, for f cycles to write the tag into path 29 of FIG. 1. If a no response occurs, MCO is formatted without AR—this indicates the absence of information in the major loops. In this connection, f is the length of the tag (in bits per chip).

Whether a yes or no response occurs, a search for $MC = MCO + f$ is initiated where f is the number of steps equal to the length of the tag and equals the number of stages between the generator and the detector less a constant integer g. When, thereafter, a yes response occurs, the system stops as indicated. At this juncture in the operation, the master count at the time of failure and the address of the accessed data is stored in the major path. Further, the master counter searches for $MCO + f$. As mentioned previously, the power circuit of a typical bubble memory is arranged to allow a sufficient number of cycles after the occurrence of a power outage to reach $MCO + f$. The system now awaits a start signal indicating a restoration of power (i.e., an external command). The stored tag is now positioned so that when a start command is received, g cycles pass before data reaches the detector.

When a start signal occurs, the master counter is set to zero and the rotating field is initiated. The controller, searches for $MC = g$ as indicated in FIG. 5. When $MC = g$, tag data is accepted from the detector for f cycles. The data is decoded in the CPU into MCO and AR/no AR. The data accepting operation terminates when $MC = MCO + f + g$.

The next operation is a determination as to whether or not "no AR" was detected. This would indicate the absence of data in the major loops. If the response is yes, the subsystem is ready for operation. If the response is no, the address register is advanced to equal that stored in the tag.

The next successive steps are, essentially, a read operation as represented by the next four blocks in FIG. 5, blocks 90, 91, 92, and 93, and the third through the seventh blocks from the top in the left-hand column of FIG. 3. The operation is the same, resulting in the swap of data into the major path during b cycles and the output after data is moved c cycles to the detector.

Thereafter, essentially, a write operation occurs as represented by blocks 95 and 96 in FIG. 5.

Block 95 indicates that the system searches for a master counter (MC) equals the address register $(AR) + b + c$ at which time data output terminates. When this occurs, a write command follows and the right-hand column of FIG. 3 repeats resulting in the writing of a block of data from an auxiliary register in controller 55 into address AR. The power outage recovery operation is complete and the system is ready for normal operation as indicated by block 97.

The invention has been described in terms of a single direct propagating path between a generator and detector where that path is used normally for data and, during a power outage, for master count and address information. Where no such direct path occurs in the bubble memory, one can be constructed when a power failure occurs. For example, a major/minor configuration having separate write and read major paths at opposite ends of the minor loops commonly includes a housekeeping minor loop with only a few bits circulating therein. A power failure in such an arrangement may result in the generation of master count and address information in the write major path as described herein. When power again comes up, the proper timing of swap and replicate operation results in the establishment of a temporary direct path between the generator and the detector through the housekeeping loop. Operation is analogous to that described hereinbefore.

Further, when a power failure occurs, the detector may be deactivated at once to conserve energy in the capacitors in the circuits to ensure the availability of a sufficient number of cycles after the failure as is discussed above.

What has been described is considered merely illustrative of the principles of this invention. Therefore, various modifications of the invention can be devised by those skilled in the art within the spirit and scope of the invention as encompassed by the following claims. For example, although the invention is described in terms of permalloy elements for moving bubbles, other type of elements such as depressions in the surface of the bubble layer, ion-implanted regions, and electrical conducting patterns can be used to move bubbles. Moreover, although the invention has been described in terms of a single bubble chip, the invention can be practiced in a multichip environment in which case the decaying drive field need be on even less than 1.8 milliseconds after a power outage commences as described.

I claim:

1. A magnetic bubble memory arrangement comprising a layer of magnetic material in which magnetic bubbles can be moved, and means for moving said bubbles in said layer along a plurality of multistage paths including a plurality of storage loops and an accessing path, said accessing path having therein a detector for bubbles stored in said loops and moved to said accessing path during normal operation of said memory, said means for moving including a driver for moving said bubbles when powered by a power supply and means for providing a power outage signal upon the occurrence of a power outage in said power supply, said arrangement including both a master clock counter and an address register, means responsive to control signals from said counter and said register for generating respectively in said accessing path a bubbles pattern representative of the number of stages MC for which bubble movement has occurred from a reference stage and the address AR of selected data for movement to said detector, said generating means including a bubble generator coupled to said accessing path and responsive to said control signals for generating said bubble pattern at a point $g + f$ stages from said detector defining thereby a tag of f bits representative of the present status of said master counter and the present address in said address register in response to said power outage signal, means responsive to a power outage signal indicative of the reinstatement of power to said power supply for setting said counter and register to zero and for moving said tag g stages to said detector for setting said counter and register to $Mc + g + 2f$ and to AR respectively where g is a constant integer equal to the number of stages between said generator and the detector less the number of stages encompassed by the tag.

2. An arrangement in accordance with claim 1 wherein said paths are defined by elements responsive to a magnetic field reorienting in said layer and said driver is operative to supply said field, said paths being organized into a plurality of minor loops and at least one major loop and means for moving bubbles from said major loop to said path.

3. An arrangement in accordance with claim 2 wherein said minor loops are organized in first and second sets associated with first and second major loops, respectively, said first and second major loops being associated with first and second stages of said path which are spaced apart a number of stages at least equal to the number of minor loops in the associated set.

4. An arrangement in accordance with claim 3 also including means for accepting data from said detector only after g cycles of said field after the occurrence of said power restore signal.

5. A magnetic bubble memory arrangement comprising a layer of material in which magnetic bubbles can be moved and drive means for moving bubbles in said layer, said drive means comprising means for defining a plurality of storage paths for storing in said layer bubble patterns representative of data, a bubble generator for providing bubble patterns in a first path adapted for moving bubbles to a detector, said memory arrangement also comprising a power supply, a power monitor for monitoring the voltage supplied by said supply and for providing a first power outage signal when a power outage commences, said arrangement also including a controller, a master counter for providing an indication of the current state of the memory, and an address register for storing the address of presently-accessed data, said controller being adapted to control said bubble generator and said drive means in a manner to generate in said first path a bubble pattern representative of the indications in said master counter and/or said address register responsive to said first power outage signal, means for generating first and second external command signals, said controller also being adapted to move bubbles between said plurality of storage paths and said first path in response to first and second external command signals in the absence of said first power outage signal.

6. An arrangement in accordance with claim 5 in which said storage paths comprise closed minor loops and said first path comprises at least one major loop and said first and second external command signals comprise read and write signals applied to said controller, said controller being adapted for moving data from said minor loops to said detector and from said generator to said minor loops in response to said first and second command signals respectively.

7. An arrangement in accordance with claim 6 in which said storage paths are defined by a pattern of elements adjacent said layer and responsive to a magnetic field reorienting in the plane of said layer for moving bubbles along said paths synchronously, said paths being organized in first and second sets of minor loops and first and second major loops associated with said sets, respectively, and in which said generator and detector are coupled to said first path at spaced apart stages therein.

8. An arrangement in accordance with claim 7 in which said elements comprise permalloy.

* * * * *